United States Patent
Tan et al.

(10) Patent No.: US 6,184,104 B1
(45) Date of Patent: Feb. 6, 2001

(54) ALIGNMENT MARK STRATEGY FOR OXIDE CMP

(75) Inventors: Juan Boon Tan; Soon Ee Neoh, both of Singapore (SG)

(73) Assignee: Chartered Semiconductor Manufacturing Ltd., Singapore (SG)

( * ) Notice: Under 35 U.S.C. 154(b), the term of this patent shall be extended for 0 days.

(21) Appl. No.: 09/151,158

(22) Filed: Sep. 10, 1998

(51) Int. Cl.$^7$ .................................................. H01L 21/465
(52) U.S. Cl. ............................................................ 438/401
(58) Field of Search ................... 438/401, 462; 257/797

(56) References Cited

U.S. PATENT DOCUMENTS

| | | | |
|---|---|---|---|
| 5,401,691 | 3/1995 | Caldwell | 437/228 |
| 5,496,777 | 3/1996 | Moriyama | 437/249 |
| 5,503,962 | 4/1996 | Caldwell | 430/317 |
| 5,648,854 | 7/1997 | McCoy et al. | 356/399 |
| 5,663,099 | 9/1997 | Okabe et al. | 438/642 |
| 5,933,744 | * 8/1999 | Chen et al. | 438/401 |
| 5,981,352 | * 11/1999 | Zhao et al. | 438/401 |

OTHER PUBLICATIONS

Wolf et al. "Silicon Processing for the VLSI Era", vol. 1, 1986, Lattice Press, pp. 187–191 and 194.*

* cited by examiner

*Primary Examiner*—Olik Chaudhuri
*Assistant Examiner*—Anh Duy Mai
(74) *Attorney, Agent, or Firm*—George O. Saile; Rosemary L.S. Pike

(57) ABSTRACT

A method for generating alignment marks on the scribe lines in which alignment marks are generated only at oxide layers is described. An alignment mark is formed in an oxide layer on a scribe line of a wafer. The alignment mark is lined with a metal layer and filled with a dielectric layer which is planarized. The alignment mark is used in aligning a reticle to pattern the metal layer and is also used in aligning a reticle to pattern the dielectric layer wherein the step of lining the alignment mark with the metal layer protects the alignment mark.

17 Claims, 7 Drawing Sheets

ALIGNMENT MARK STRATEGY FOR OXIDE CMP

BACKGROUND OF THE INVENTION (1) Field of the Invention

The invention relates to the fabrication of integrated circuit devices, and more particularly, to a method of generating alignment marks only on the oxide layers in the fabrication of integrated circuits.

(2) Description of the Prior Art

In the fabrication of integrated circuit devices, multiple layers of conductors and insulators are deposited and patterned to construct the integrated circuit. It is critical to align each subsequent layer with the previous layer with precision. This is typically accomplished by using alignment marks. A wafer stepper tool uses the alignment marks on a wafer as a reference point for adjusting a reticle over the wafer. The reticle contains the pattern to be generated within the layer. The reticle must be precisely aligned to the previous layer. A wafer stepper uses one of at least three methods to detect the alignment marks; these are light interference, bright field contrast, or dark field polarization effect.

Some methods generate alignment marks within the scribe line area. Scribe lines define a cutting portion where devices formed on a wafer are cut apart after manufacture. Some alignment mark schemes require fresh alignment marks to be generated at every layer, using the previous layer's marks to assure alignment. Alignment marks occupy more and more space as the number of interconnect layers increases and scribe line area becomes scarce. Some alignment schemes transfer the alignment marks from layer to layer. However, this cannot be done when planarization is performed, such as chemical mechanical polishing (CMP). In this case, the alignment marks must be recovered after CMP. These recovery or repair steps lengthen the process cycle and increase the production costs.

U.S. Pat. No. 5,503,962 to Caldwell discloses an alignment mark and CMP process in which alignment marks are formed in oxide layers using the same process as for contact and via formation. However, there is no mention of how to generate a quality alignment mark or of how to use the alignment mark beyond the next layer. U.S. Pat. No. 5,663,099 to Okabe et al teaches a method of forming an alignment mark. U.S. Pat. No. 5,401,691 to Caldwell teaches a method of recovering alignment marks after CMP. U.S. Pat. No. 5,496,777 to Moriyama teaches forming an alignment mark for each layer in a widened portion of a scribe line. U.S. Pat. No. 5,648,854 to McCoy et al discloses an alignment system to detect the wafer edge and global alignment marks.

SUMMARY OF THE INVENTION

A principal object of the present invention is to provide an effective and very manufacturable method of generating alignment marks in the manufacture of an integrated circuit device.

A further object of the invention is to provide a method of generating alignment marks in which alignment mark recovery is avoided.

Yet another object is to provide a method of generating alignment marks in which alignment marks are generated only at oxide layers.

A still further object is to provide a method of generating alignment marks in which alignment marks printed on the oxide layer are used for the next two subsequent layers.

Yet another object is to provide a method of generating alignment marks on the scribe lines in which alignment marks are generated only at oxide layers.

Yet another object of the invention is to provide a method of generating alignment marks on the scribe lines in which alignment marks printed on the oxide layer are used for the next two subsequent layers.

In accordance with the objects of this invention a method for generating alignment marks on the scribe lines in which alignment marks are generated only at oxide layers is achieved. An alignment mark is formed in an oxide layer on a scribe line of a wafer. The alignment mark is lined with a metal layer and filled with a dielectric layer which is planarized. The alignment mark is used in aligning a reticle to pattern the metal layer and is also used in aligning a reticle to pattern the dielectric layer wherein the step of lining the alignment mark with the metal layer protects the alignment mark.

BRIEF DESCRIPTION OF THE DRAWINGS

In the accompanying drawings forming a material part of this description, there is shown.

DESCRIPTION OF THE PREFERRED EMBODIMENTS

Figure 1:
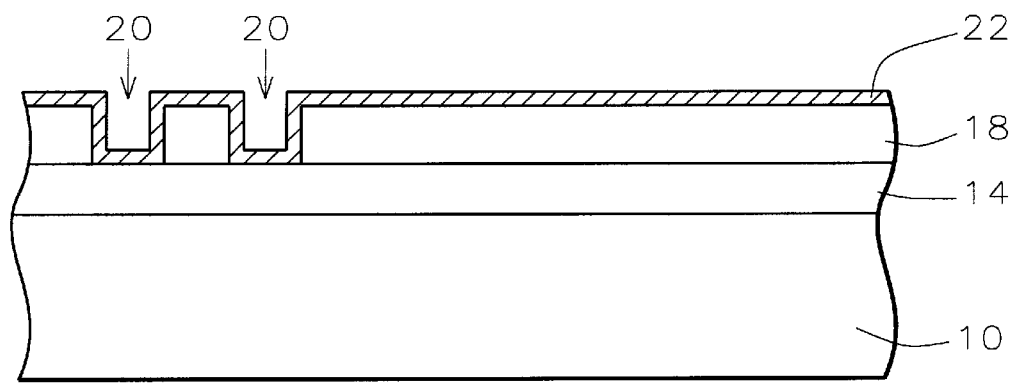
FIGS. 1 through 4, 6, and 8 schematically illustrate in cross-sectional representation a preferred embodiment of the present invention.

Referring now more particularly to FIG. 1, there is shown an illustration of a scribe line portion of a partially completed integrated circuit. The semiconductor substrate 10 is preferably composed of silicon having a (100) crystallographic orientation. The MOSFET portion of the integrated circuit will not be illustrated in these figures since the invention concerns the alignment marks within the scribe lines. However, the alignment marks are fabricated within the MOSFET process steps, as will be described below.

A layer of polysilicon 14 is deposited over the surface of the substrate to a thickness of between about 1500 and 1900 Angstroms. This layer is patterned elsewhere to form gate electrodes and interconnection lines, not shown.

A dielectric layer 18 is deposited over the polysilicon layer to a depth of 7500 to 9500 Angstroms. This is a silicon oxide layer such as borophosphosilicate glass (BPSG), for example. Alignment marks 20 are etched into the BPSG layer on the scribe line. The formation of these initial contact alignment marks is not discussed in detail. The scope of the present invention is a new alignment strategy for the back-end process from metal I onward. These and subsequent alignment marks are illustrated as being generated side by side. However, it will be understood by those skilled in the art that this is for illustration purposes only and that the alignment marks may not be generated side by side.

A metal layer 22 having a thickness of between about 5000 and 8000 Angstroms is deposited over the BPSG layer surface and within the contact openings, not shown, in the MOSFET portion of the integrated circuit. In the scribe line portion illustrated, the metal I layer 22 conformally fills the contact alignment marks 20 so that the alignment mark is transferred to the metal layer.

The metal layer is coated with photoresist and the wafer is put into the stepper. The reticle is aligned with the alignment marks 20 and the metal layer is patterned in the MOSFET portion of the integrated circuit, not shown. The metal layer 22 is normally removed from the scribe line, but in the process of the present invention, the metal layer 22 remains within the alignment marks 20.

Figure 2:
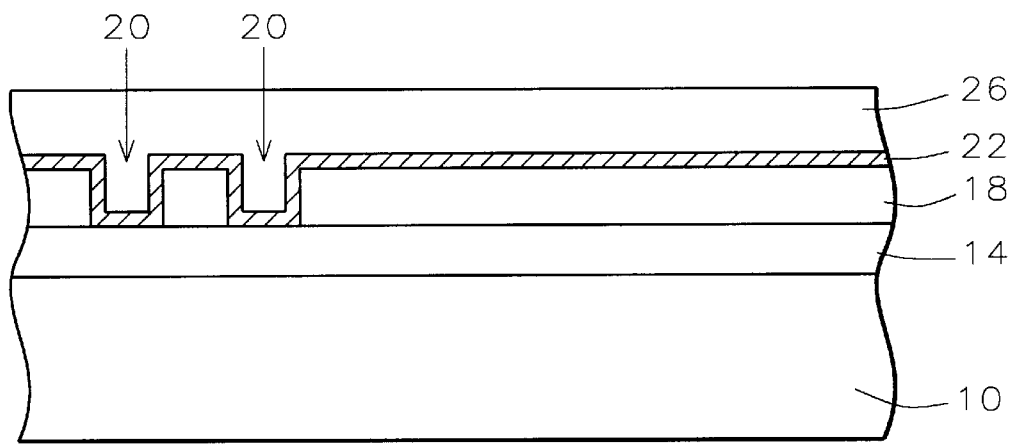

Referring now to FIG. 2, an intermetal dielectric layer 26 is deposited over the patterned metal I layer. The intermetal dielectric layer may comprise, for example, tetraethoxysilane (TEOS) oxide and have a thickness of between about 6000 and 10,000 Angstroms. The interlevel dielectric layer 26 is transparent so that the alignment marks 20 can still be used by the stepper to align the reticle for patterning the interlevel dielectric layer. The dielectric layer is also planarized, such as by chemical mechanical polishing (CMP), as shown.

Figure 3:
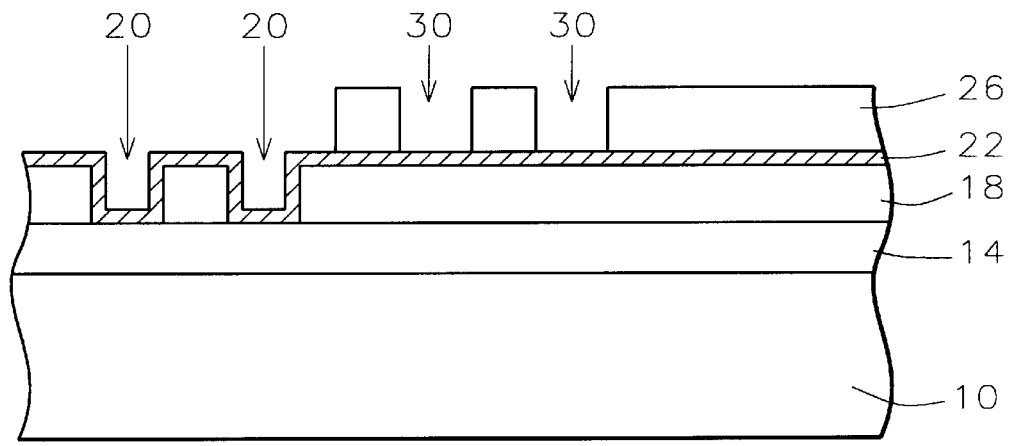

The interlevel dielectric layer is patterned to form via I openings, not shown, in the MOSFET section of the integrated circuit. Since the dielectric layer 26 has been planarized, the alignment marks have been lost. Instead of recovering the alignment marks, which increases cost and process time, another set of alignment marks 30 also is etched into the interlevel dielectric layer 26. No extra processing is required since the etching is done during via etching. The mask over the previous alignment marks is clear so that the dielectric layer 26 is removed in that area, as shown in FIG. 3. In this way, there is a possibility that the alignment marks 20 may be used at subsequent layers.

Figure 4:
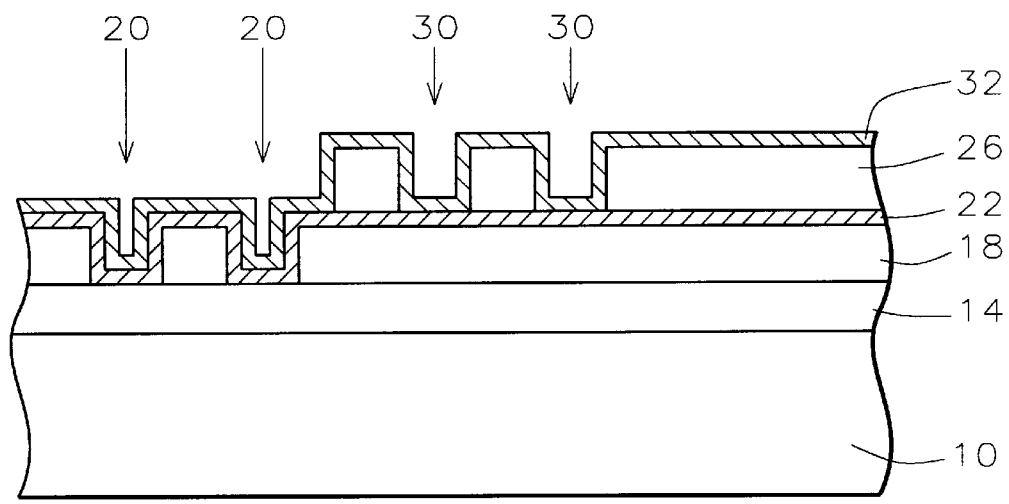

Now, a second metal layer 32 having a thickness of between about 5000 and 8000 Angstroms is deposited over the intermetal dielectric layer surface and within the via I openings, not shown, in the MOSFET portion of the integrated circuit. In the scribe line portion illustrated in FIG. 4, the metal II layer 32 conformally fills the via I scribe line alignment marks 30 so that the alignment mark is transferred to the metal layer. The metal II layer also covers the metal I layer in the area of the first contact alignment marks 20.

Figures 5A, 5B:
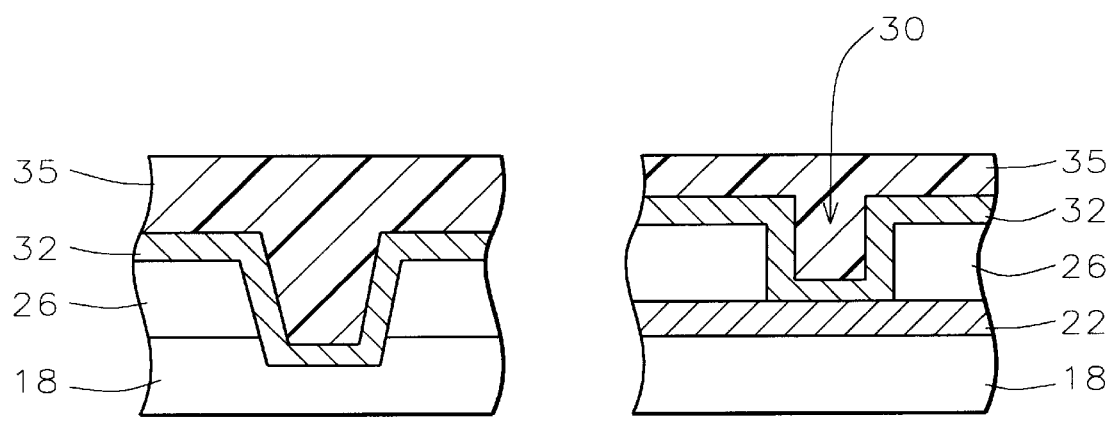
FIGS. 5A and 7A schematically illustrate in cross-sectional representation an alignment mark of the prior art.
FIGS. 5B and 7B schematically illustrate in cross-sectional representation an alignment mark of the present invention.

FIG. 5A illustrates an alignment mark of the prior art at the metal layer. The alignment mark is etched into the intermetal dielectric layer 26. However, large variations in alignment mark's depth may occur in the intermetal dielectric layer because the alignment mark is etched into the underlying BPSG layer 18, as shown. The metal layer 32 is deposited over the surface of the dielectric layer and within the alignment mark opening. The wafer is covered with photoresist 35 and the alignment mark is used to align the reticle for patterning the metal layer. The inconsistent alignment mark depth causes an inconsistent alignment signal. Also, the tapered shape of the alignment mark of the prior art causes degradation of alignment quality.

FIG. 5B illustrates an alignment mark of the present invention at the metal layer. The alignment mark of the present invention has little variation and is more robust than that of the prior art. The metal stopper layer 22 prevents the etching of the alignment mark into the underlying layer 18. This is true at every level of the alignment mark, such as alignment mark 30 illustrated in FIG. 5B. Therefore, the alignment mark depth is consistent.

The metal layer is now patterned in the MOSFET area. In the scribe line area, the metal layer is left unetched as a metal protector layer over the alignment marks. If the metal layer 32 were removed over the alignment marks, the shape of the alignment marks would be altered. That is, the corners or edges would become rounded.

Figure 6:
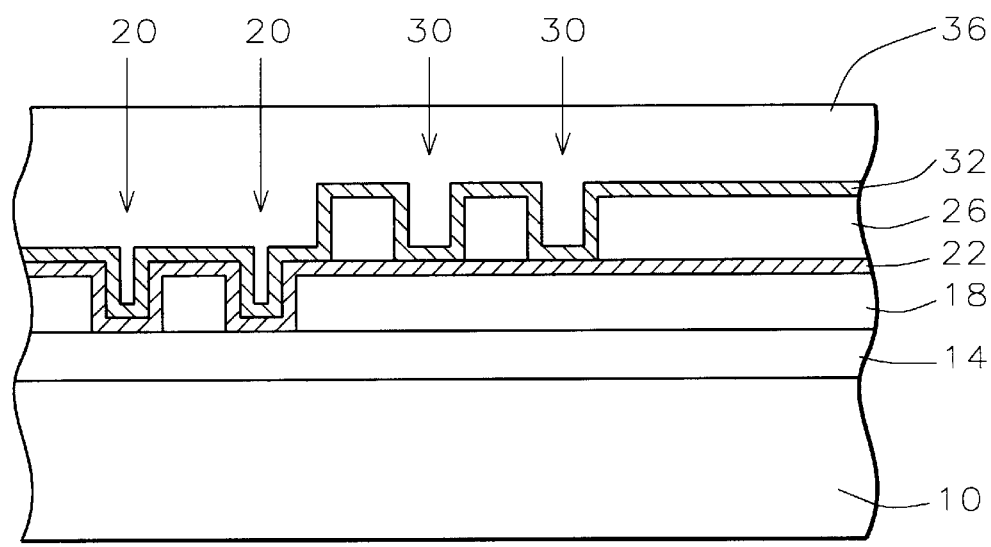

Referring now to FIG. 6, a second intermetal dielectric layer 36 is deposited over the surface of the substrate. This is another oxide layer, for example, TEOS oxide, having a thickness of between about 8000 and 10,000 Angstroms. The dielectric layer 36 is now to be patterned. Since the dielectric layer is transparent, it can be aligned using the via I scribe line alignment marks 30.

Figures 7A, 7B:
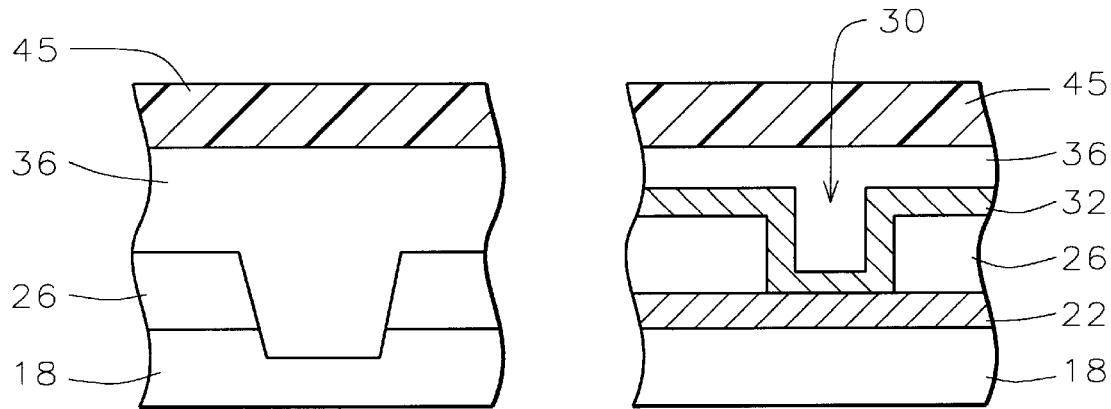

FIG. 7A illustrates an alignment mark of the prior art at the oxide via II layer. As discussed with reference to FIG. 5A, variations in oxide depth may result in overetching of the alignment mark so that the underlying BPSG layer 18 is etched into. The dielectric layer 36 is deposited over the surface of the wafer and within the alignment mark. The surface is coated with photoresist 45. The wafer is put into the stepper for alignment using the alignment mark.

FIG. 7B illustrates the more robust alignment mark of the present invention at the oxide via II layer. The metal stopper layer 22 prevents the overetching of the underlying oxide layer 18. The metal layer 32 acts as a protector of the alignment mark so that it can be used for the next two levels; that is, the metal II layer and the via II layer illustrated here.

Figure 8:
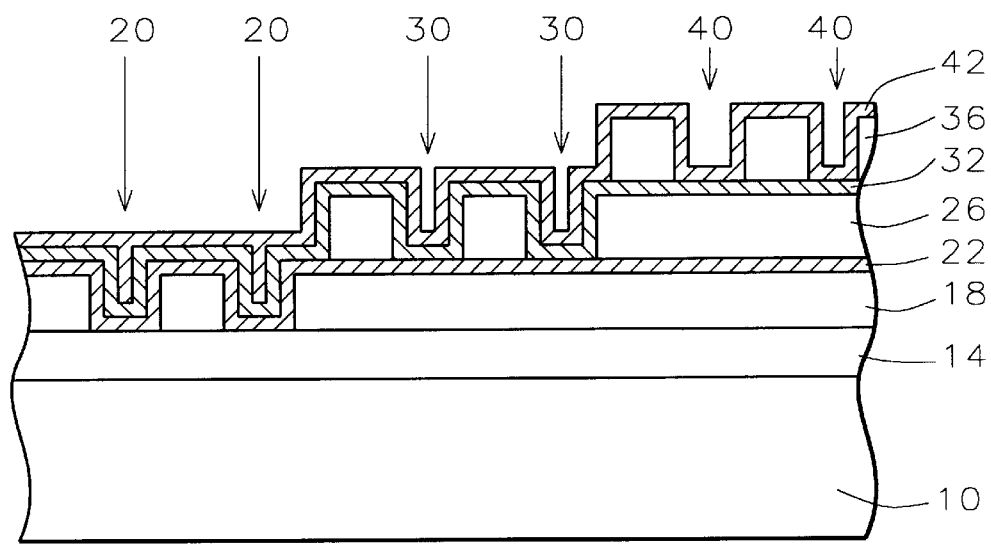

Referring now to FIG. 8, the interlevel dielectric layer 36 is patterned to form via II openings, not shown, in the MOSFET section of the integrated circuit. The new set of alignment marks 40 is etched into the interlevel dielectric layer 36. No extra processing is required since the etching is done during via etching. The mask over the previous alignment marks 30 and 20 is clear so that the dielectric layer 36 is removed in that area, as shown in FIG. 8. The alignment marks 30 could still be used at this point, but it is recommended that new alignment marks 40 be generated in the current oxide layer to assure high quality alignment.

A third metal layer 42 having a thickness of between about 5000 and 8000 Angstroms is deposited over the intermetal dielectric layer surface and within the via II openings, not shown, in the MOSFET portion of the integrated circuit. In the scribe line portion illustrated, the metal II layer 42 conformally fills the via II scribe line alignment marks 40 so that the alignment mark is transferred to the metal layer. The metal II layer also covers the metal I layer in the area of the via II scribe line alignment marks 30 and the first contact alignment marks 20. It can be seen that these first alignment marks 20 are now completely filled in with metal. Processing continues with additional levels as necessary. New scribe line alignment marks are printed on each oxide layer. The alignment marks can be used for two succeeding layers.

Figure 9:
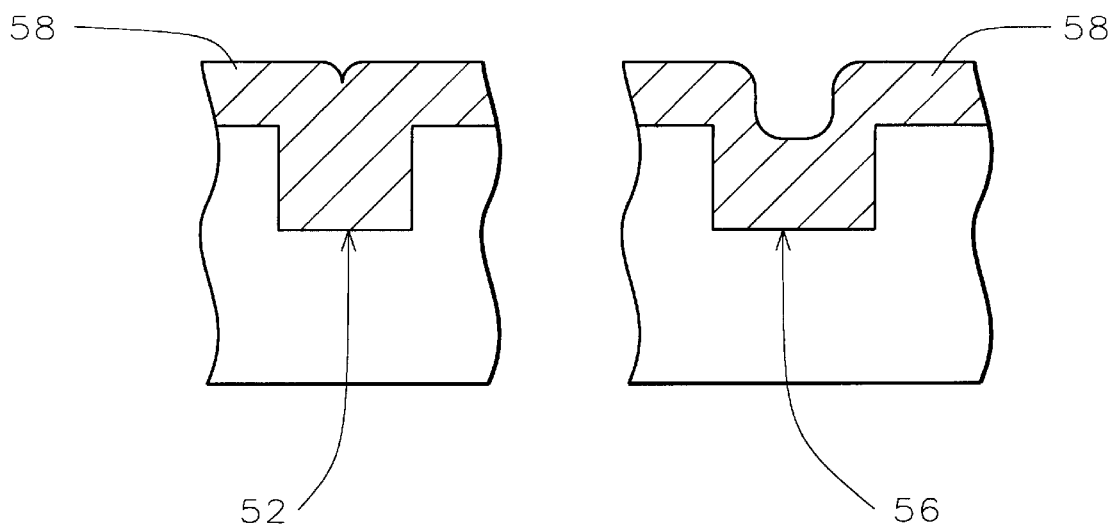
FIGS. 9, 10A, and 10B illustrate in cross-sectional representation plug filling techniques associated with the process of the present invention.
Figure 10A:
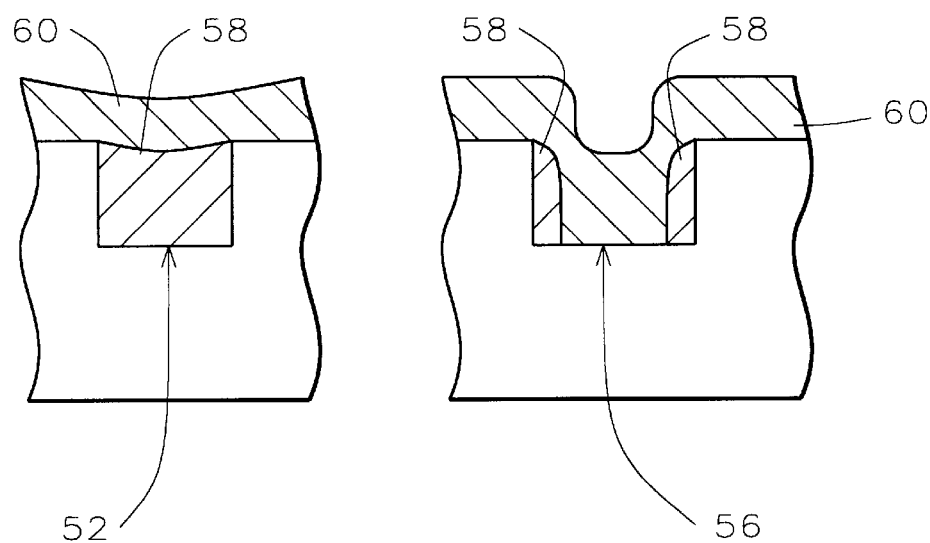
Figure 10B:
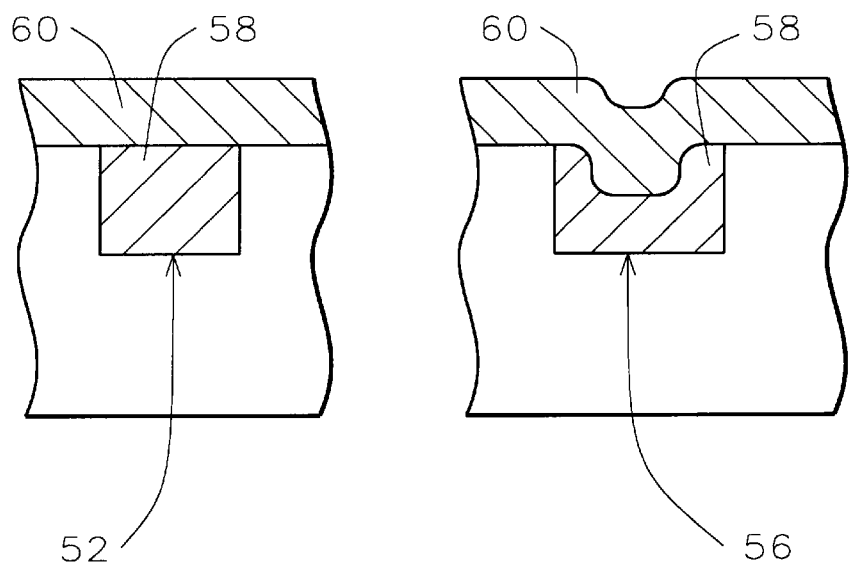

The process of the present invention can be discussed in combination with an etchback process. For example, FIG. 9 illustrates a typical via 52 in the MOSFET area. 56 illustrates a typical alignment mark which is typically much larger than the via 52. The via 52 and alignment mark 56 are filled with a metal layer 58, such as tungsten. FIG. 10A illustrates the results of the etchback process. The metal is removed from the mark 56 that is much larger than the via size. Then, for example, the metal II layer 60 may be deposited. Alternatively, FIG. 10B illustrates the results of a CMP process. Metal 58 is left within any space for cavity regardless of its size. The process of the present invention can be extended to include the CMP process also. CMP can also be used on an oxide layer.

Figures 11A, 11B:
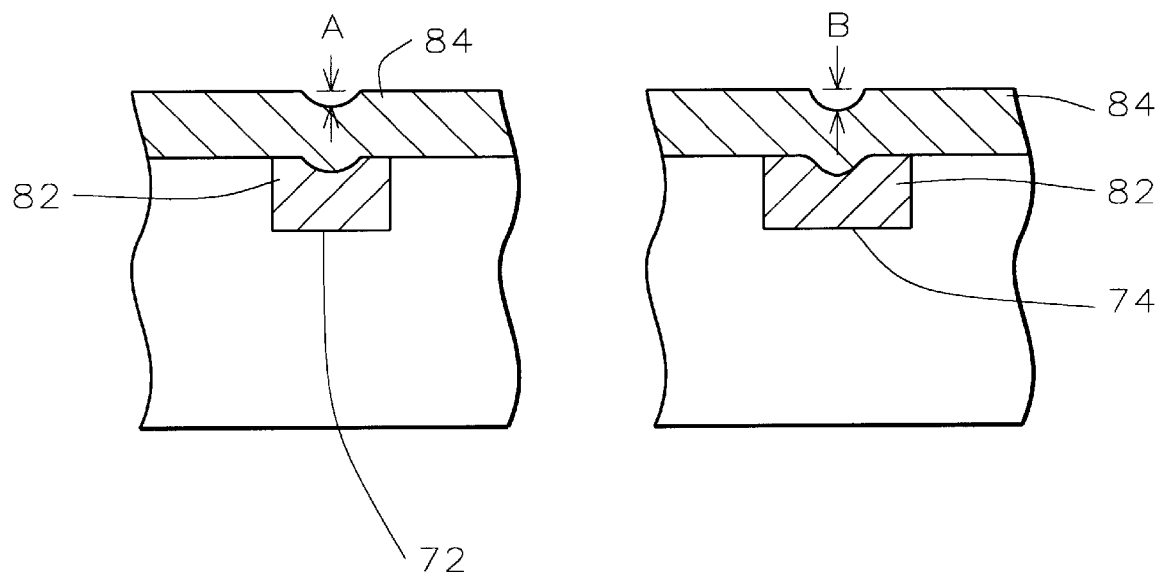
FIGS. 11A through 11D illustrate in cross-sectional representation different alignment mark sizes in the process of the present invention.
Figure 11C:
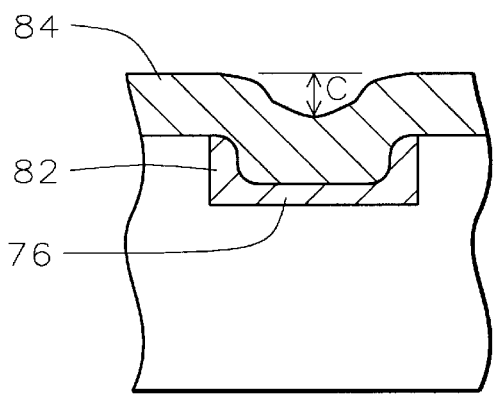
Figure 11D:
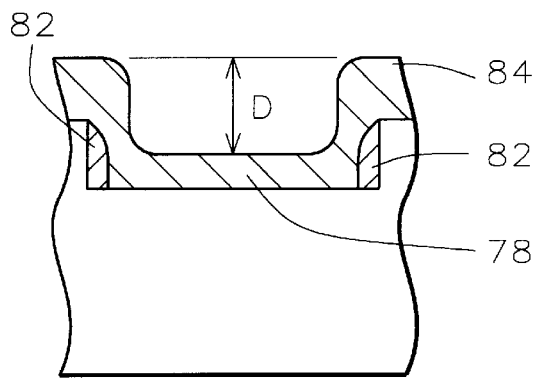

In the tungsten etchback process, the step height of the alignment mark can be controlled by controlling the space size of the mark. FIGS. 11A–D illustrate the effect of changing the alignment mark space size. FIG. 11A illustrates alignment mark 72 having a width of less than two times the thickness of the tungsten plug 82. Metal layer 84 overlies the tungsten plug. This alignment mark has step height A. FIG. 11B illustrates alignment mark 74 having a width approximately equal to two times the thickness of the tungsten plug 82. This alignment mark has step height B. FIG. 11C illustrates alignment mark 76 having a width approximately equal to three times the thickness of the tungsten plug 82. This alignment mark has step height C. FIG. 11D illustrates alignment mark 78 having a width of greater than four times the thickness of the tungsten plug 82. This alignment mark has step height D. Note that there is a relation between the alignment mark's step height and its width or size.

The step height can be carefully engineered by tuning the mark size in relation to the tungsten thickness. The step height of the alignment mark is an important consideration especially for phase or interference contrast alignment techniques. By choosing carefully the right step height, the best interference signal can be obtained. Dark field and bright field alignment techniques do best with the alignment mark size illustrated in FIG. 11D because this mark has the highest step height and the clearest defined boundary.

The process of the invention provides an alignment scheme for the metal I layer onward in which new alignment marks are printed on the scribe lines only on the oxide layers after planarization. The alignment marks can be used for alignment of two succeeding layers. Recovery of alignment marks is avoided. The metal stopper and protector layers of the alignment marks provide for robust, optimized alignment marks that can be used for two succeeding layers. The process of the present invention can be used with steppers using any one of the three methods to detect alignment marks: light interference, bright field contrast, or dark field polarization effect.

While the invention has been particularly shown and described with reference to the preferred embodiments thereof, it will be understood by those skilled in the art that various changes in form and details may be made without departing from the spirit and scope of the invention.

What is claimed is:

1. A method of using alignment marks to align a reticle in a stepper in the fabrication of an integrated circuit device comprising:

providing a first alignment mark on a scribe line in a contact level overlying a semiconductor substrate;

depositing a first metal layer over said contact level wherein said first metal layer is deposited conformally within said first alignment mark;

patterning said first metal layer wherein said first alignment mark is used to align said reticle used in said patterning;

depositing a first intermetal dielectric layer overlying said first metal layer and planarizing said first intermetal dielectric layer whereby said first alignment mark is covered by said planarized first intermetal dielectric layer;

patterning said first intermetal dielectric layer to form first via openings wherein said first alignment mark is used to align said reticle used in said patterning and wherein a second alignment mark is etched into said first intermetal dielectric layer on said scribe line and wherein said first intermetal dielectric layer overlying said first alignment mark is etched away;

depositing a second metal layer over said first intermetal dielectric layer wherein said second metal layer is deposited conformally within said first and second alignment marks;

patterning said second metal layer wherein said second alignment mark is used to align said reticle used in said patterning;

depositing a second intermetal dielectric layer overlying said second metal layer and planarizing said second intermetal dielectric layer whereby said second alignment mark is covered by said planarized second intermetal dielectric layer; and patterning said second intermetal dielectric layer to form second via openings wherein said second alignment mark is used to align said reticle used in said patterning and wherein a third alignment mark is etched into said second intermetal dielectric layer on said scribe line and wherein said second intermetal laver overlying said second alignment mark is etched away to complete said fabrication of said integrated circuit device.

2. The method according to claim 1 wherein any number of said alignment marks can be formed.

3. The method according to claim 1 wherein said stepper detects said first, second, and third alignment marks by light interference.

4. The method according to claim 1 wherein said stepper detects said first, second, and third alignment marks by bright field contrast.

5. The method according to claim 1 wherein said stepper detects said first, second, and third alignment marks by dark field polarization effect.

6. The method according to claim 1 wherein said contact level comprises borophosphosilicate glass (BPSG).

7. The method according to claim 1 wherein said first and second intermetal dielectric layers comprise tetraethoxysilane (TEOS) oxide.

8. The method according to claim 1 wherein said first and second intermetal dielectric layers comprise silicon oxide.

9. A method of forming a series of alignment marks in the fabrication of an integrated circuit comprising:

forming a first alignment mark in a contact layer on a scribe line of a wafer;

conformally lining said first alignment mark with a first metal layer;

patterning said first metal layer wherein said first alignment mark is used in aligning a reticle to pattern said first metal layer;

thereafter filling said first alignment mark with a first oxide layer;

planarizing said first oxide layer;

patterning said first oxide layer wherein said first alignment mark is also used in aligning a reticle to pattern said first oxide layer wherein said step of lining said first alignment mark with said first metal layer protects said first alignment mark and wherein during said patterning of said first oxide layer, a second alignment mark is formed in said first oxide layer on said scribe line and said first oxide layer overlying said first alignment mark is etched away;

conformally lining said second alignment mark with a second metal layer;

patterning said second metal layer wherein said second alignment mark is used in aligning a reticle to pattern said second metal layer;

thereafter filling said second alignment mark with a second oxide layer;

planarizing said second oxide layer; and patterning said second oxide layer wherein said second alignment mark is also used in aligning a reticle to pattern said second oxide layer wherein said step of lining said second alignment mark with said second metal layer protects said second alignment mark and wherein said second oxide layer overlying said second alignment mark is etched away; and repeating said previous two steps to form said series of alignment marks in the fabrication of said integrated circuit.

10. A method of using alignment marks to align a reticle in a stepper in the fabrication of an integrated circuit device comprising:

providing a first alignment mark on a scribe line in a contact level overlying a semiconductor substrate;

depositing a first metal layer over said contact level wherein said first metal layer is deposited conformally within said first alignment mark;

patterning said first metal layer wherein said first alignment mark is used to align said reticle used in said patterning;

thereafter depositing a first intermetal dielectric layer overlying said first metal layer and planarizing said first intermetal dielectric layer whereby said first alignment mark is covered by said planarized first intermetal dielectric layer;

patterning said first intermetal dielectric layer to form first via openings wherein said first alignment mark is used to align said reticle used in said patterning and wherein a second alignment mark is etched into said first intermetal dielectric layer on said scribe line and wherein said first intermetal layer overlying said first alignment mark is etched away;

depositing a second metal layer over said first intermetal dielectric layer wherein said second metal layer is deposited conformally within said second alignment mark and overlying said first metal layer within said first alignment mark;

patterning said second metal layer wherein said first and second alignment marks are used to align said reticle used in said patterning;

depositing a second intermetal dielectric layer overlying said second metal layer and planarizing said second intermetal dielectric layer whereby said second alignment mark is covered by said planarized second intermetal dielectric layer; and patterning said second intermetal dielectric layer to form second via openings wherein said second alignment mark is used to align said reticle used in said patterning and wherein a third alignment mark is etched into said second intermetal dielectric layer on said scribe line and wherein said second intermetal dielectric layer overlying said second alignment mark is etched away to complete said fabrication of said integrated circuit device.

11. The method according to claim 10 wherein any number of said alignment marks can be formed.

12. The method according to claim 10 wherein said stepper detects said first, second, and third alignment marks by light interference.

13. The method according to claim 10 wherein said stepper detects said first, second, and third alignment marks by bright field contrast.

14. The method according to claim 10 wherein said stepper detects said first, second, and third alignment marks by dark field polarization effect.

15. The method according to claim 10 wherein said contact level comprises borophosphosilicate glass (BPSG).

16. The method according to claim 10 wherein said first and second intermetal dielectric layers comprises tetraethoxysilane (TEOS) oxide.

17. The method according to claim 10 wherein said first and second intermetal dielectric layers comprise silicon oxide.

* * * * *